United States Patent
Barlow

(10) Patent No.: US 7,167,032 B1
(45) Date of Patent: Jan. 23, 2007

(54) SELF-ADJUSTING SCHMITT TRIGGER

(75) Inventor: Danny S. Barlow, South Jordan, UT (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/815,403

(22) Filed: Mar. 31, 2004

(51) Int. Cl.
*H03K 3/12* (2006.01)

(52) U.S. Cl. .................................................. 327/205

(58) Field of Classification Search ................ 327/205, 327/206, 208, 210
See application file for complete search history.

(56) References Cited

U.S. PATENT DOCUMENTS

| | | | | |
|---|---|---|---|---|
| 4,376,251 A * | 3/1983 | Kobayashi et al. | ......... | 327/165 |
| 4,539,489 A | 9/1985 | Vaughn | ............ | 327/205 |
| 5,341,046 A * | 8/1994 | Crafts | ............ | 327/427 |
| 5,489,866 A * | 2/1996 | Diba | ............ | 327/206 |
| 5,945,859 A * | 8/1999 | Pang | ............ | 327/206 |
| 6,091,265 A * | 7/2000 | Singh | ............ | 326/83 |
| 6,127,898 A * | 10/2000 | Naura | ............ | 331/57 |
| 6,433,602 B1 | 8/2002 | Lall et al. | ............ | 327/205 |
| 6,549,048 B2 * | 4/2003 | Tailliet | ............ | 327/205 |
| 6,566,926 B1 * | 5/2003 | Patterson | ............ | 327/206 |
| 6,700,424 B2 * | 3/2004 | Feng | ............ | 327/206 |
| 6,870,413 B1 * | 3/2005 | Chang et al. | ............ | 327/205 |

* cited by examiner

*Primary Examiner*—My-Trang Nu Ton
(74) *Attorney, Agent, or Firm*—MacPherson Kwok Chen & Heid LLP; Jonathan W. Hallman

(57) ABSTRACT

A Schmitt trigger includes a PMOS transistor and an NMOS transistor, each having a gate coupled to an output voltage terminal. The Schmitt trigger is configured such that an input voltage that switches on the PMOS transistor determines a low voltage threshold and an input voltage that switches on the NMOS transistor determines a high voltage threshold. By coupling devices such as diodes to either or both of the PMOS and NMOS transistors, a margin between the low voltage threshold and ground and between the high voltage threshold and a supply voltage are maintained as the supply voltage is reduced. In addition, hysteresis is maintained or increased as supply voltage is increased.

19 Claims, 5 Drawing Sheets

SELF-ADJUSTING SCHMITT TRIGGER

TECHNICAL FIELD

The present invention relates generally to Schmitt triggers, and more particularly to a Schmitt trigger than self-adjusts hysteresis across a range of power supply voltages.

BACKGROUND

Schmitt triggers are basic circuit blocks for both digital and analog applications. By using hysteresis, Schmitt triggers can turn a signal having a noisy or asymmetrical transition into a signal with a sharp transition region. Thus, Schmitt triggers are useful for clearing up noisy signals and to do logic level conversions. To achieve high-input impedance and relatively-low power consumption, a CMOS Schmitt trigger such as trigger 100 shown in FIG. 1 is particularly advantageous. A serial stack formed from PMOS transistors P1 and P2 and NMOS transistors N1 and N2 couple between a supply voltage VCC and ground (VSS). The gate of each transistor couples to an input voltage $V_{in}$. As will be described further, as $V_{in}$ is varied with respect to a low voltage threshold and a high voltage threshold, an output voltage $V_{out}$ for a node between transistors P2 and N2 will swing either to VCC or VSS. The low and high voltage thresholds may be denoted as VIL and VIH, respectively. The transition of $V_{out}$ may be further understood with respect to voltages Vfp and Vfn at the sources, respectively, of a PMOS transistor P3 and an NMOS transistor N3. When transistors P3 and P1 are both on, they form a voltage divider that determines the value of Vfp according to the relative sizes of these transistors. Similarly, when transistors N3 and N1 are both on, they form a voltage divider that determines the value of Vfn according to the relative sizes of these transistors.

Should $V_{in}$ be at 0 V, $V_{out}$ will be at VCC. Transistor N3 will thus be on whereas transistor P3 will be off. As $V_{in}$ is increased above the threshold voltage of transistor N1, N1 will be conductive. In turn, Vfn will equal a proportion of VCC as determined by the relative sizes of transistors N1 and N3 as discussed above. As $V_{in}$ is further increased past Vfn plus the threshold voltage for transistor N2, N2 will start to become conductive. At this point, regenerative switching will start to occur with respect to $V_{out}$. As N2 begins to conduct, $V_{out}$ will be pulled towards ground. The drop in voltage is fed back through transistor N3, which will start to turn off, thereby dropping Vfn. In turn, the dropping voltage at the drain of transistor N2 means that N2 will turn on even more robustly, thereby making $V_{out}$ drop even more. In response to $V_{out}$ being pulled to ground, transistor P3 will begin to turn on. The source of transistor P2 will thus be pulled low so that transistor P2 begins to turn off, causing $V_{out}$ to reduce even further. In this fashion, the positive feedback through transistor N3 will rapidly pull $V_{out}$ to ground. The high voltage threshold VIH for Schmitt trigger 100 will thus be approximately equal to Vfn plus the threshold voltage ($V_T$) for transistor N2. Should transistors N1 and N3 be matched, Vfn will be approximately equal to VCC/2 such that the high voltage threshold VIH will be roughly equal to VCC/2+$V_T$.

Now suppose $V_{in}$ is gradually decreased from the high voltage threshold. As $V_{in}$ drops below Vfp−$V_T$, an analogous operation occurs through the upper portion of the stack with respect to transistors P1, P2, and P3 such that the low voltage threshold VIL equals Vfp−$V_T$. Thus, as $V_{in}$ dips below VIL, $V_{out}$ will rapidly swing to VCC. The resulting relationship between $V_{in}$ and $V_{out}$ with respect to VIL and VIH may be seen in FIG. 2 for Schmitt trigger 100.

Because $V_{out}$ will depend upon VCC, the hysteresis provided by the high and low voltages threshold will also change as VCC is changed. In modern logic systems, it is common to have a number of supply voltage levels such as 3.3 V, 2.5 V, and 1.8 V. Using the same Schmitt trigger for such a range of supply voltage levels, however, results in undesirable changes in hysteresis. For example, consider the feedback provided by PMOS transistor P3. When both transistors P3 and P1 are conducting, voltage Vfp will be approximately equal to a voltage-divided portion of VCC as discussed previously. When input voltage $V_{in}$ is a threshold voltage below Vfp, transistor P2 will begin to switch on, starting the regenerative switching process that will rapidly pull $V_{out}$ to VCC. But note what happens for lower levels of VCC. The threshold voltage for transistor P2 remains relatively constant such that VIL becomes closer to ground. A similar effect occurs for VIH in that it becomes closer to VCC. However, a user will typically desire a certain margin between VIL and ground and also between VIH and VCC. To satisfy a desired margin at lower values for VCC, P3 may be made relatively small with respect to P1 such the Vfp is kept closer to VCC. In turn, this makes VIL higher, thereby satisfying the desired margin. Although a reduced size for P3 thus makes operation at low VCC satisfactory, a problem will arise as higher levels of VCC are used with the same transistor size for P3. The feedback provided by such a small transistor at these higher voltages becomes proportionally less and less such that little or no hysteresis is provided. In other words, whereas the margin becomes too small unless a relatively-small transistor P3 is used at low VCC, the same transistor size produces too high of a margin at relatively-high values for VCC.

Conventional Schmitt triggers configured for use in systems having a broad range of supply voltage levels thus may include additional complex circuitry that monitors the power supply voltage level and adjusts the feedback used within the Schmitt trigger accordingly so that the desired amount of hysteresis is maintained. Discrete feedback strengths optimized for particular voltage ranges are selected by this circuitry. However, this additional circuitry occupies a relatively large circuit area which is undesirable given the general need to minimize circuit dimensions for greater density. In addition, this additional circuitry requires its own DC supply current, thereby increasing power consumption.

Accordingly, there is a need in the art for improved Schmitt triggers for operation across a range of power supply voltages.

SUMMARY

In accordance with one aspect of the invention, a Schmitt trigger is provided that is configured to receive an input voltage and produce an output voltage that changes states with respect to a high voltage threshold and a low voltage threshold. The Schmitt trigger includes a first feedback path configured to determine one of the voltage thresholds; and at least one diode coupled to the first feedback path such that an on-current through the first feedback path is reduced as a supply voltage for the Schmitt trigger is reduced.

In accordance with another aspect of the invention, a method for altering the hysteresis for a Schmitt trigger is provided, wherein the Schmitt trigger's hysteresis is defined with respect to a high voltage threshold and a low voltage threshold, the Schmitt trigger including a first feedback path that determines one of the voltage thresholds. The method includes the acts of: changing a supply voltage for the Schmitt trigger; and in response to the changed supply voltage, affecting an on-current through the first feedback path using at least one diode such that the determined voltage threshold satisfies a predetermined threshold.

In accordance with another aspect of the invention, a Schmitt trigger is provided that is configured to receive an input voltage and produce an output voltage that changes states with respect to a high voltage threshold and a low voltage threshold. The Schmitt trigger includes: a first feedback path configured to determine one of the voltage thresholds; and means for reducing an on-current through the first feedback path as a supply voltage for the Schmitt trigger is reduced.

BRIEF DESCRIPTION OF THE DRAWINGS

Use of the same reference symbols in different figures indicates similar or identical items.

DETAILED DESCRIPTION

Figure 3A:
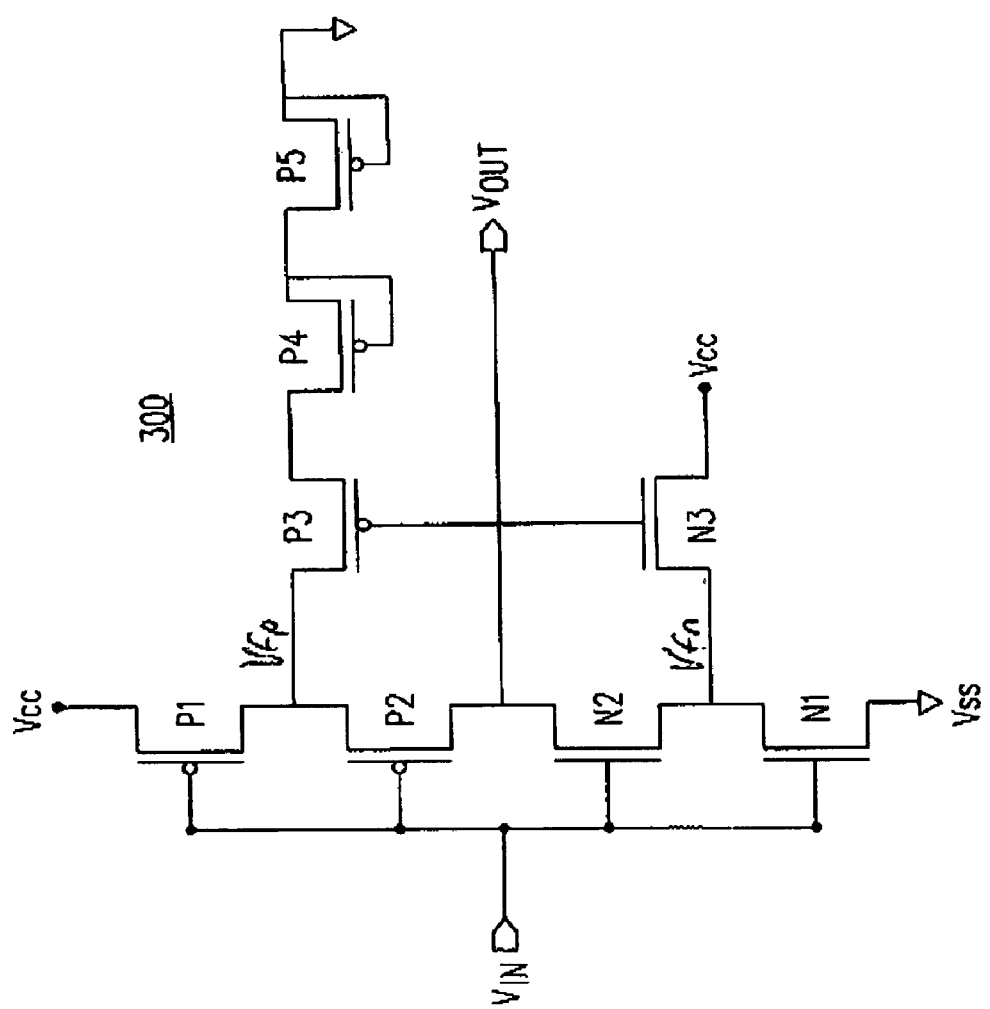
FIG. 3a is a schematic illustration of a self-adjusting Schmitt trigger according to one embodiment of the invention.

A self-adjusting Schmitt trigger is provided that adjusts the amount of feedback responsive to a power supply voltage level so as to maintain or increase the Schmitt trigger' hysteresis. As the power supply voltage level is changed from one discrete level to another, the self-adjusting Schmitt trigger adjusts the feedback accordingly. An example embodiment for a self-adjusting Schmitt trigger 300 is shown in FIG. 3a.

Figure 1:
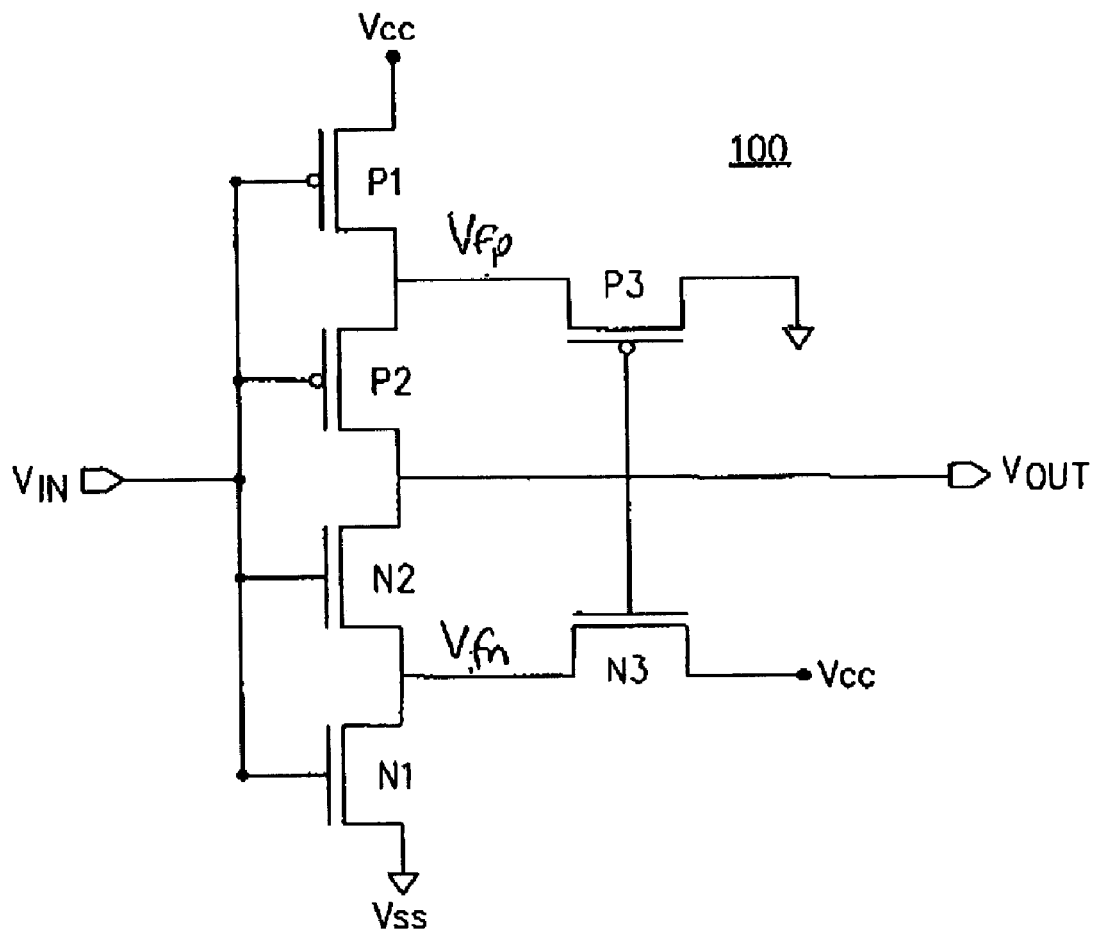
FIG. 1 is schematic illustration of a conventional Schmitt trigger.
Figure 2:
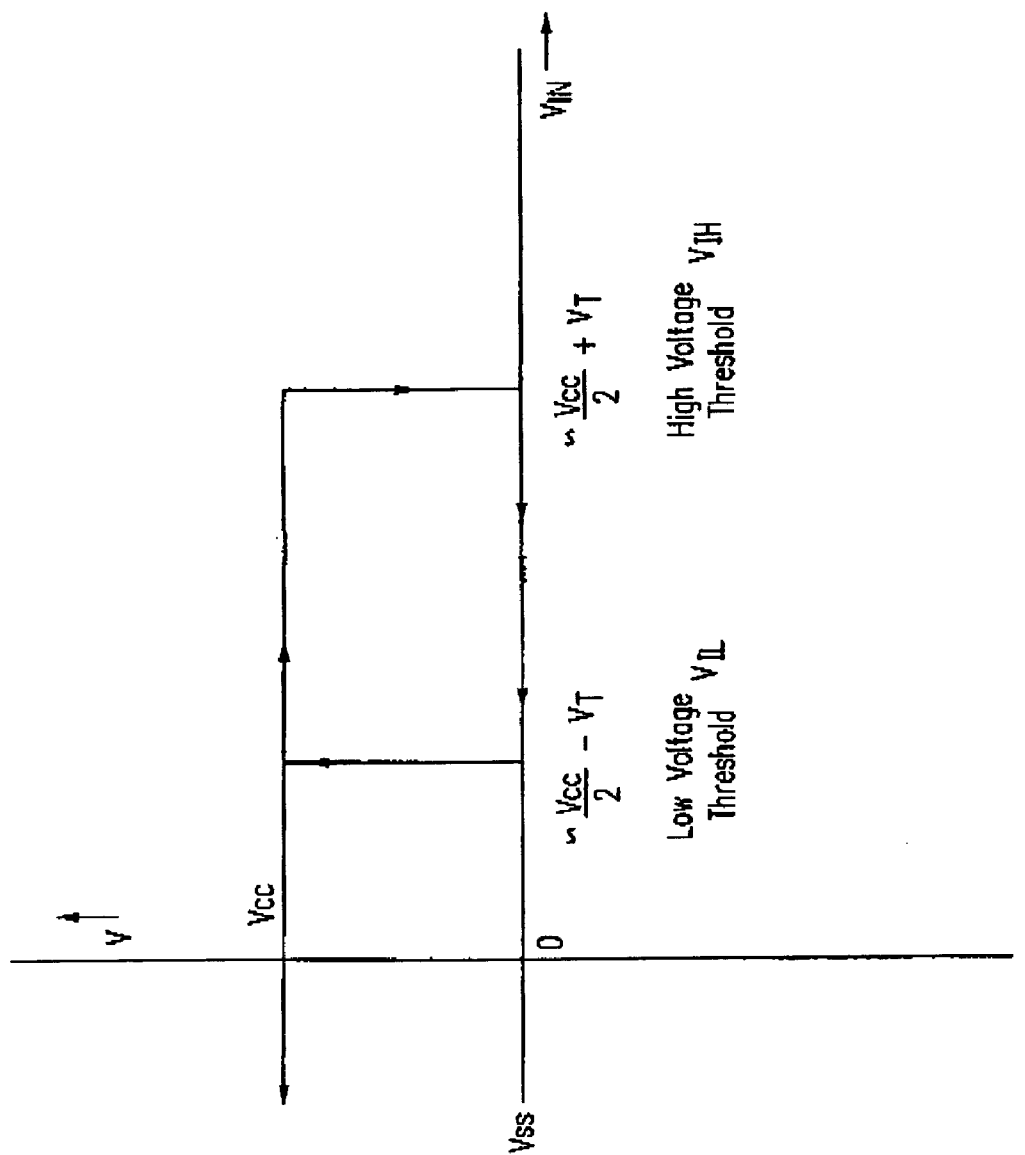
FIG. 2 illustrates the relationship between the input voltage and the output voltage for the Schmitt trigger of FIG. 1.

Schmitt trigger 300 uses the basic CMOS stacked structure provided by arranging PMOS transistors P1, P2, and NMOS transistors N1, N2 between VCC and ground as described with respect to Schmitt trigger 100 of FIG. 1. PMOS transistor P3 and NMOS transistor N3 respond to $V_{out}$ through feedback paths to adjust voltages Vfp and Vfn as also described with respect to Schmitt trigger 100. To provide a self-adjusting feedback mechanism, however, Schmitt trigger 300 includes one or more diodes in either or both of the feedback paths, i.e., between PMOS transistor P3 and ground and/or between NMOS transistor N3 and VCC. In the embodiment illustrated, only the PMOS transistor P3 feedback path includes these diodes, namely two feedback diodes formed as diode-connected PMOS transistors P4 and P5. Because they act as diodes, diode-connected PMOS transistors P4 and P5 will also be denoted as diodes P4 and P5 in the following discussion.

Figure 4:
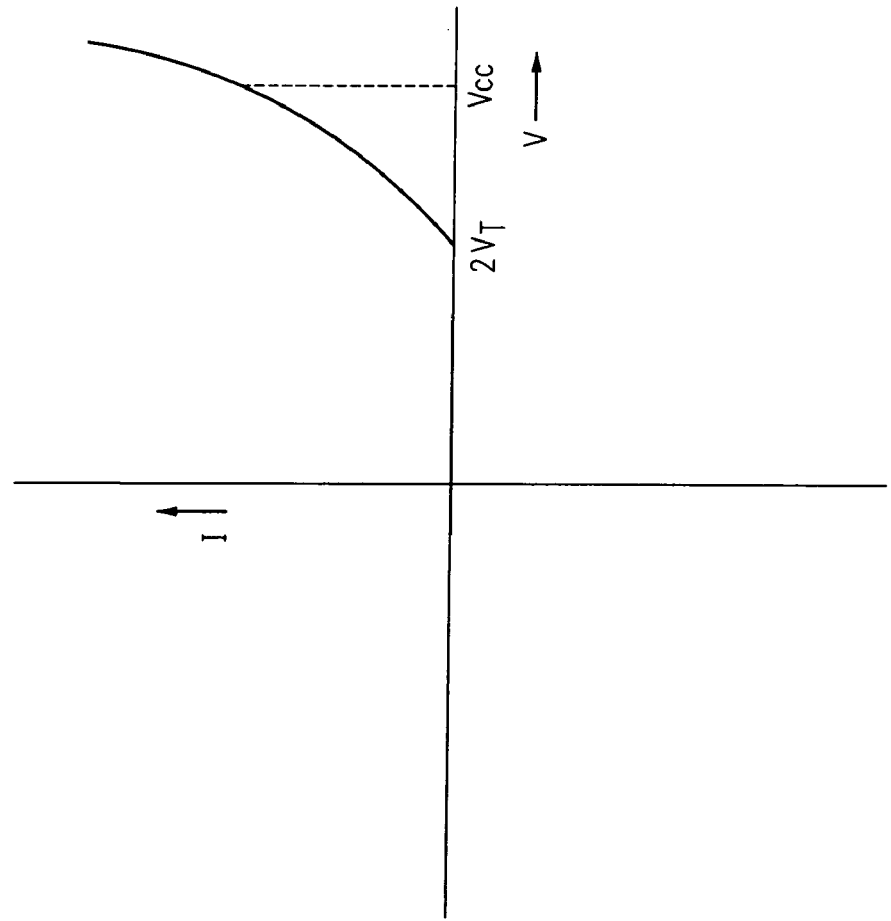
FIG. 4 illustrates the current/voltage behavior for the serially-connected diode-connected transistors in the Schmitt trigger of FIG. 3.
Figure 1:
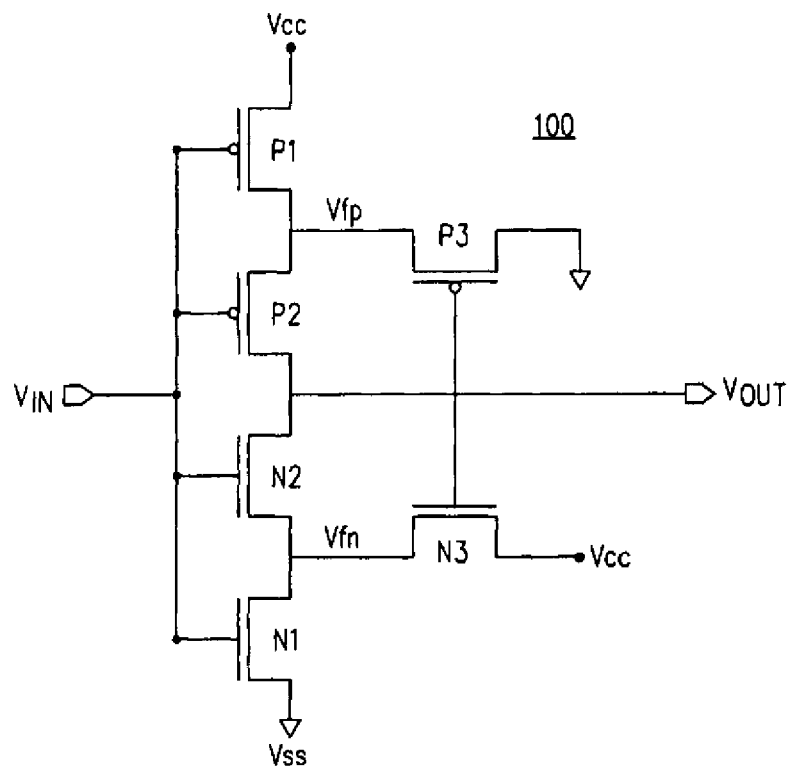
Figure 3A:
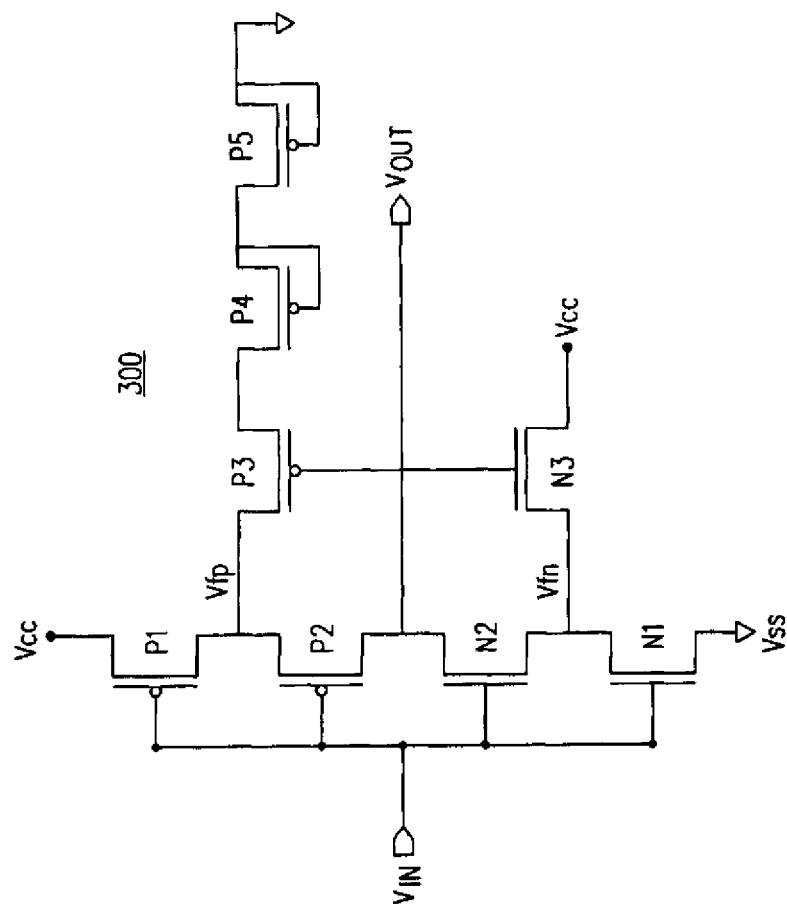
Figure 3B:
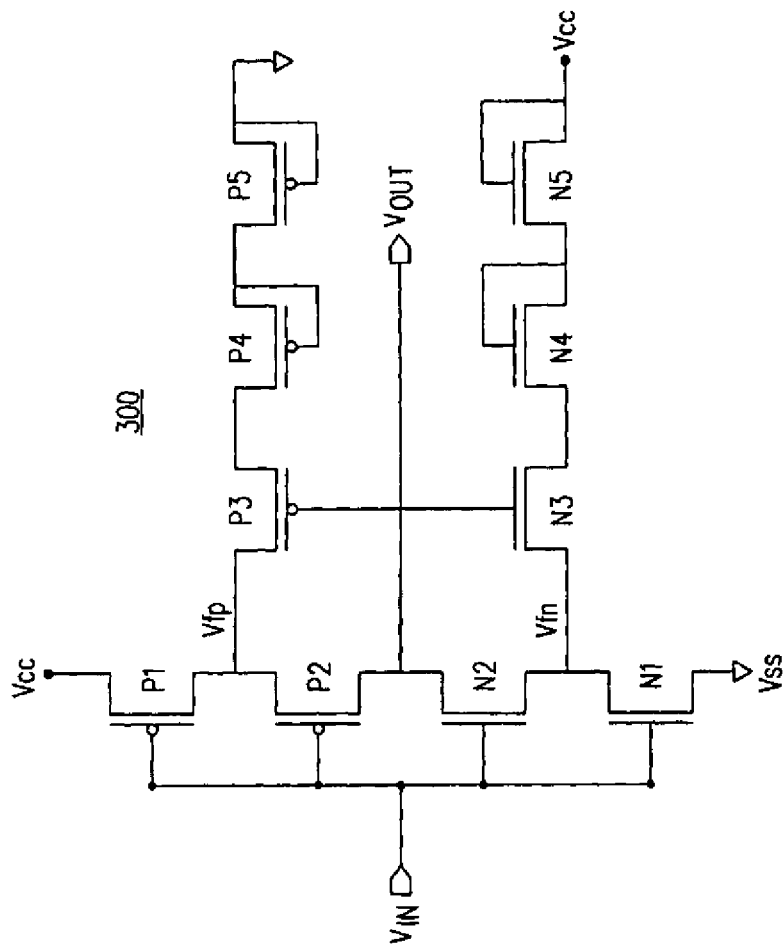

As discussed previously, a relatively-large size for transistor P3 will maintain the desired amount of hysteresis at higher values of VCC. But such a relatively-large size for transistor P3 will make the margin between VIL and ground too small at lower values for VCC. By serially coupling diodes P4 and P5 between the drain of P3 and ground, this dilemma is solved because P3 may be sized so as to provide an adequate amount of hysteresis at higher levels of VCC yet still satisfy a desired margin between VIL and ground at lower levels of VCC. The benefits of using diodes P4 and P5 may be further explained with respect to FIG. 4, which illustrates how the current through these serially-connected diodes varies as a function of the voltage impressed at the source of diode-connected transistor P4. Each diode-connected transistor P4 and P5 can only be conducting if its threshold transistor $V_T$ is exceeded across its source and drain. Thus, until the voltage at the source of diode-connected transistor P4 exceeds $2V_T$, no current will be conducted by P4 and P5. At that point, the current through each diode will increase exponentially as the voltage increases at the source of diode-connected transistor P4.

Consider the operation of Schmitt trigger 300 at a relatively-low value of VCC such as 1.5 V. Because $V_T$ for a diode-connected transistor is typically between 0.5 and 0.7 V, such a value for VCC will either not be enough for diodes P4 and P5 to conduct or be such that diodes P4 and P5 conduct a relatively-small amount of current. If diodes P4 and P5 are never conductive, voltage Vfp will be maintained at VCC. Thus, VIL will be approximately equal to VCC minus $V_T$ for transistor P2. Should diodes P4 and P5 be weakly conductive, the influence of the relatively-large transistor P3 becomes greatly reduced. In other words, the effect of transistor P3 being serially-coupled with diode-connected transistors P4 and P5 is that transistor P3 acts as a relatively-small transistor. As an alternative to being denoted as relatively small, such a transistor may also be denoted as being "weak" as compared to a relatively-larger transistor, which in turn may be denoted as being "strong." By incorporating diodes P4 and P5, Schmitt trigger 300 gains the benefit provided by a strong transistor P3 at higher values for VCC and that provided a weak transistor P3 at lower values for VCC. Note that the inclusion of diodes for either transistor P3 or N3 has the effect of reducing hysteresis at lowered values of VCC. In turn, this raises the possibility that, should both transistors be coupled to current-reducing diode(s), hysteresis would be eliminated at lower values of VCC. To guard against such a possibility, just one transistor (such as for P3 as shown in FIG. 3a) may be chosen for coupling with these diode(s).

Figure 3B:
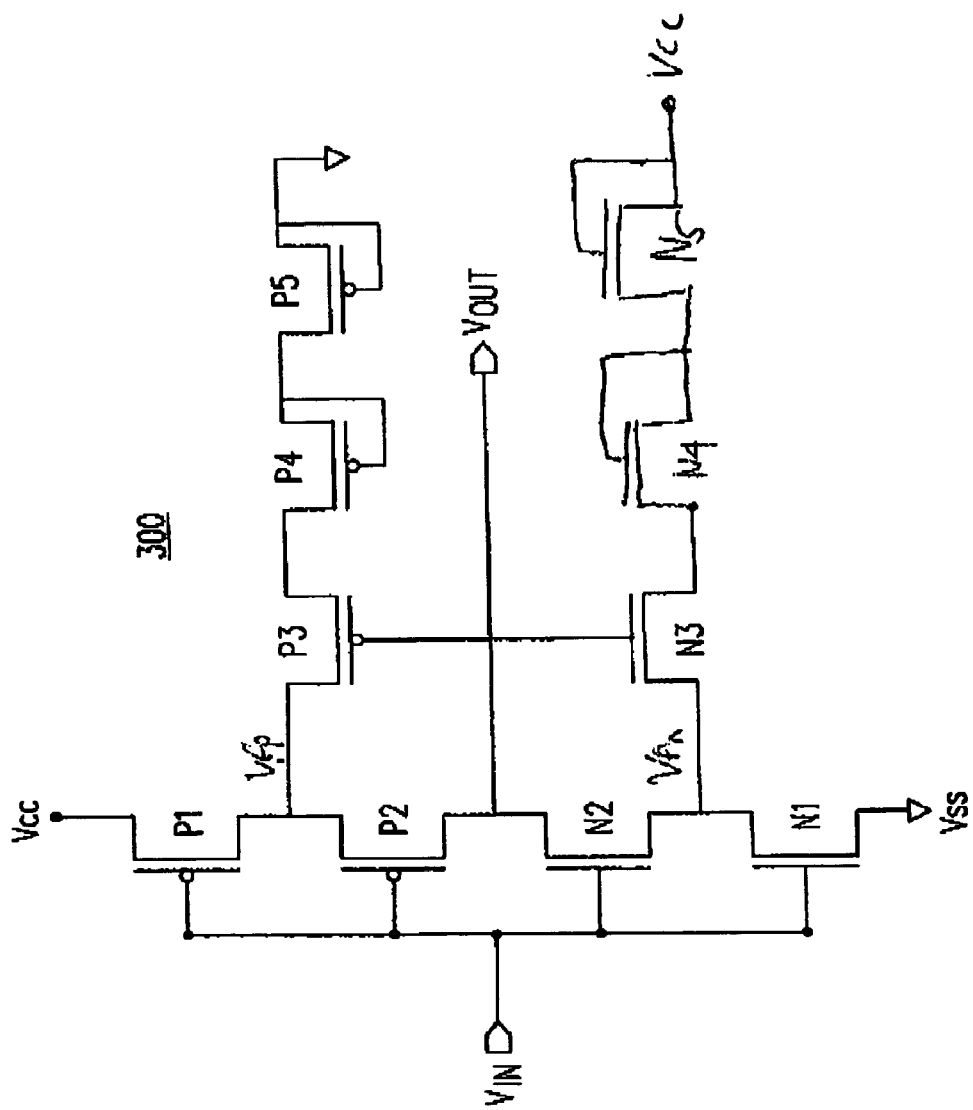
FIG. 3b is a schematic illustration of a self-adjusting Schmitt trigger according to an embodiment of the invention.

Rather than couple one or more diodes to transistor P3, current-limiting diodes may instead by coupled to transistor N3 as discussed above. For example, FIG. 3b illustrates a Schmitt trigger 350 in which diode-connected NMOS transistors N4 and N5 couple between VCC and the drain of transistor N3.

Figure 5:
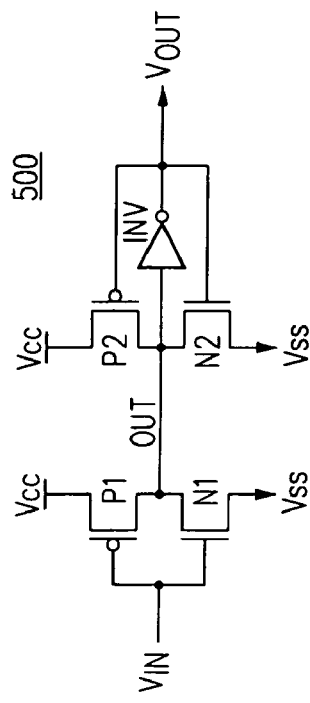
FIG. 5 is a schematic illustration of a conventional Schmitt trigger having an alternative topology with respect to the Schmitt trigger of FIG. 1.
Figure 6:
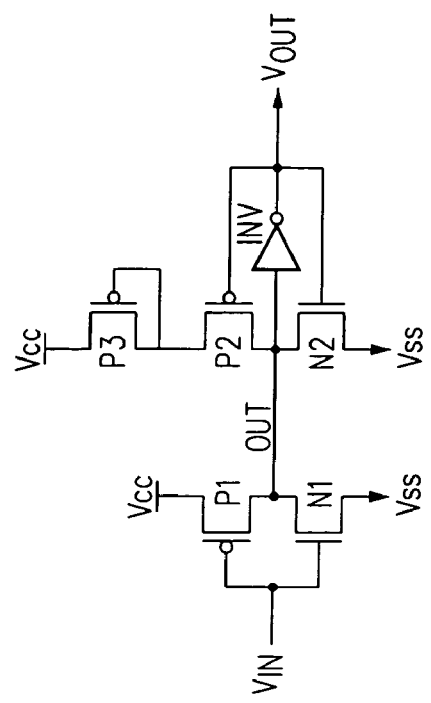
FIG. 6 is a schematic diagram for a self-adjusting Schmitt trigger having the alternative topology for the Schmitt trigger of FIG. 5 according to one embodiment of the invention.

Although Schmitt trigger 300 solves the hysteresis problem for Schmitt trigger 100 of FIG. 1, it will be appreciated that the current-limiting feature described with respect to diodes P4 and P5 may be applied to alternative Schmitt trigger topologies so long as these topologies include a PMOS transistor analogous to P3 of Schmitt trigger 300 and an NMOS transistor analogous to N3. In other words, given a topology wherein an NMOS transistor has its gate tied to $V_{out}$ so as to control the high voltage threshold and wherein a PMOS transistor also has its gate tied to $V_{out}$ so as to control the low voltage threshold, the current limiting features discussed with respect to FIGS. 3a and 3b may be applied. For example, consider the prior art Schmitt trigger 500 shown in illustrated in FIG. 5. Transistors N2 and P2 for Schmitt trigger 500 are analogous to transistors N3 and P3 as just discussed. Accordingly, diodes may be coupled to a terminal of either or both of these transistors to reduce their on-current at reduced supply voltages. For example, as shown in FIG. 6, Schmitt trigger 500 may be altered so that the source of transistor P2 may be coupled to a diode-connected PMOS transistor P3 whose source couples to VCC. In this fashion, the current through P2 is weakened at lower values of VCC, thereby maintaining a desired hysteresis VIL margin, but is strengthened at higher values of VCC, thereby maintaining or increasing the hysteresis.

The above-described embodiments of the present invention are merely meant to be illustrative and not limiting. It will thus be obvious to those skilled in the art that various changes and modifications may be made without departing from this invention in its broader aspects. Accordingly, the appended claims encompass all such changes and modifications as fall within the true spirit and scope of this invention.

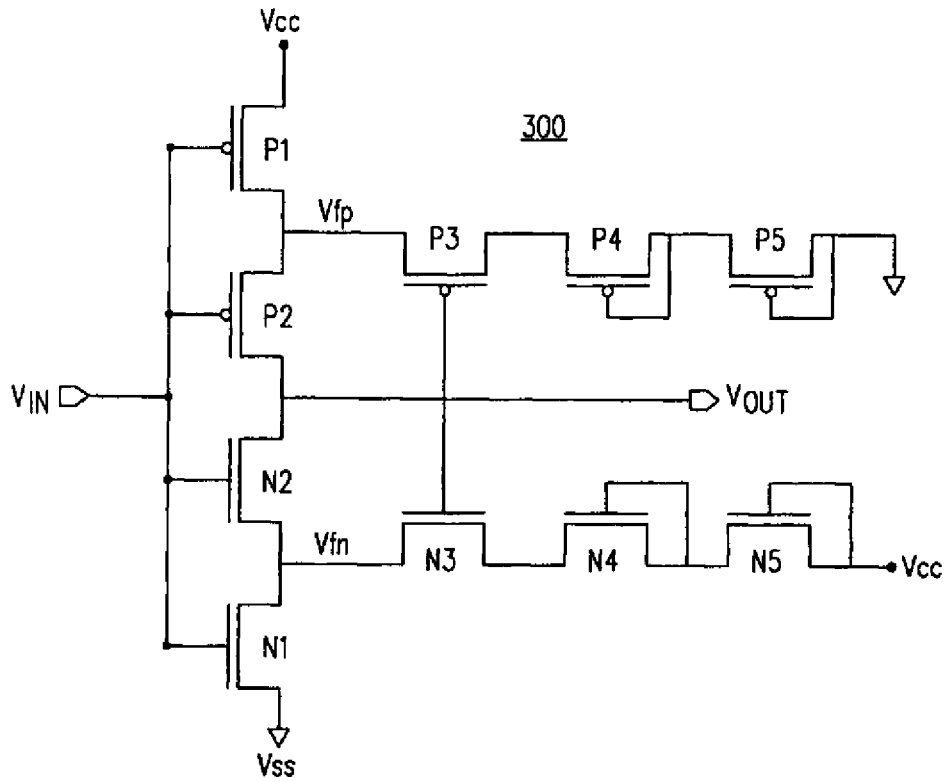

I claim:

1. A Schmitt trigger configured to receive an input voltage and produce at an output node an output voltage that changes states with respect to a high voltage threshold and a low voltage threshold, comprising:
a first feedback path having a first transistor with a gate terminal coupled to the output node and with a second terminal coupled to a ground node to determine one of the voltage thresholds;
a second feedback path having a second transistor with a gate terminal coupled to the output node and with a second terminal coupled to a power supply voltage node to determine a remaining one of the voltage thresholds; and
at least one diode coupled to a path selected from the first feedback path and the second feedback path such that an on-current through the selected path is reduced as a supply voltage for the Schmitt trigger is reduced.

2. The Schmitt trigger of claim 1, wherein the Schmitt trigger is a CMOS Schmitt trigger.

3. The Schmitt trigger of claim 1, wherein the selected path is the first feedback path.

4. The Schmitt trigger of claim 3, wherein the first transistor comprises a first PMOS transistor having its second terminal coupled to the at least one diode and wherein the second transistor comprises a first NMOS transistor.

5. The Schmitt trigger of claim 4, wherein the at least one diode comprises a first diode and a second diode.

6. The Schmitt trigger of claim 4, wherein the second terminal of the first PMOS transistor is a drain terminal, the at least one diode coupled between the drain terminal and the ground node.

7. The Schmitt trigger of claim 1, wherein the selected path is the second feedback path.

8. The Schmitt trigger of claim 7, wherein the second transistor comprises a first NMOS transistor having its second terminal coupled to the at least one diode and wherein the first transistor comprises a first PMOS transistor.

9. The Schmitt trigger of claim 8, wherein the at least one diode comprises a first diode and a second diode.

10. The Schmitt trigger of claim 8, wherein the second terminal of the first NMOS transistor is a drain terminal, the at least one diode coupled between the drain terminal and the power supply voltage node.

11. The Schmitt trigger of claim 4, further comprising a second and a third PMOS transistor and a second and a third NMOS transistor all coupled in series between the power supply voltage node and the ground node.

12. A method of altering the hysteresis for a Schmitt trigger, the hysteresis being defined with respect to a high voltage threshold and a low voltage threshold, the Schmitt trigger including a first feedback path that determines one of the voltage thresholds, the method comprising:
changing a supply voltage for the Schmitt trigger; and
in response to the changed supply voltage, affecting an on-current through the first feedback path using at least one diode such that the determined voltage threshold satisfies a predetermined threshold.

13. The method of claim 12, wherein the first feedback path determines the low voltage threshold, the adjusting the supply voltage act comprises lowering the supply voltage, and the affecting the on-current comprises reducing the on-current through the first feedback path such that the low voltage threshold is offset from ground by the predetermined threshold.

14. The method of claim 12, wherein the first feedback path determines the high voltage threshold, the adjusting the supply voltage act comprises increasing the supply voltage, and the affecting the on-current comprises increasing the on-current through the first feedback path such that the high voltage threshold is offset from the supply voltage by the predetermined threshold.

15. A Schmitt trigger configured to receive an input voltage and produce at an output node an output voltage that changes states with respect to a high voltage threshold and a low voltage threshold, comprising:
a first feedback path having a first transistor with a gate terminal coupled to the output node and with a second terminal coupled to a ground node to determine one of the voltage thresholds;
a second feedback path having a second transistor with a gate terminal coupled to the output node and with a second terminal coupled to a power supply voltage node to determine a remaining one of the voltage thresholds; and
means for reducing an on-current through a path selected from the first feedback path and the second feedback path as a supply voltage for the Schmitt trigger is reduced.

16. The Schmitt trigger of claim 15, wherein the selected path is the second feedback path and the means for reducing the on-current comprises at least one diode.

17. The Schmitt trigger of claim 16, wherein the at least one diode comprises a diode-connected NMOS transistor.

18. The Schmitt trigger of claim 17, wherein the diode-connected NMOS transistor couples between the power supply voltage node and the second terminal of the second transistor.

19. A Schmitt trigger configured to receive an input voltage and produce at an output node an output voltage that changes states with respect to a high voltage threshold and a low voltage threshold, comprising:
a first feedback path having a first transistor with a gate terminal coupled to the output node and with a second terminal coupled to a ground node to determine one of the voltage thresholds;
a second feedback path having a first transistor with a gate terminal coupled to the output node and with a second terminal coupled to a ground node to determine one of the voltage thresholds;

a second feedback path having a second transistor with a gate terminal coupled to the output node and with a second terminal coupled to a power supply voltage node to determine a remaining one of the voltage thresholds;

at least one diode coupled to a path selected from the first feedback path and the second feedback path such that an on-current through the selected path is reduced as a supply voltage for the Schmitt trigger is reduced;

a first inverter configured to invert the input voltage to provide an inverted output at an output terminal; and a second inverter configured to invert the inverted output from the output terminal of the first inverter, wherein a first terminal of the second transistor couples to the output terminal of the first inverter.

* * * * *

UNITED STATES PATENT AND TRADEMARK OFFICE
CERTIFICATE OF CORRECTION

PATENT NO.       : 7,167,032 B1
APPLICATION NO.  : 10/815403
DATED            : January 23, 2007
INVENTOR(S)      : Danny S. Barlow It is certified that error appears in the above-identified patent and that said Letters Patent is hereby corrected as shown below:

The Title page, showing an illustrative figure, should be deleted and substitute therefor the attached title page.

Delete 3 Formal Drawing sheets 1, 3 and 4, for Figure 1, Figure 3A, and Figure 3B and substitute therefor the Drawing sheets, consisting of figs. 1, 3A-3B as shown on the attached pages.

Signed and Sealed this

Twenty-second Day of September, 2009

David J. Kappos
*Director of the United States Patent and Trademark Office*

(12) United States Patent
Barlow

(10) Patent No.: US 7,167,032 B1
(45) Date of Patent: Jan. 23, 2007

(54) SELF-ADJUSTING SCHMITT TRIGGER

(75) Inventor: Danny S. Barlow, South Jordan, UT (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/815,403

(22) Filed: Mar. 31, 2004

(51) Int. Cl.
H03K 3/12 (2006.01)
(52) U.S. Cl. ...................................... 327/205
(58) Field of Classification Search ............ 327/205, 327/206, 208, 210
See application file for complete search history.

(56) References Cited

U.S. PATENT DOCUMENTS

| 4,376,251 | A | * | 3/1983 | Kobayashi et al. | 327/165 |
| 4,539,489 | A | | 9/1985 | Vaughn | 327/205 |
| 5,341,046 | A | * | 8/1994 | Crafts | 327/427 |
| 5,489,866 | A | * | 2/1996 | Diba | 327/206 |
| 5,945,859 | A | * | 8/1999 | Pang | 327/206 |
| 6,091,265 | A | * | 7/2000 | Singh | 326/83 |
| 6,127,898 | A | * | 10/2000 | Naura | 331/57 |
| 6,433,602 | B1 | | 8/2002 | Lall et al. | 327/205 |
| 6,549,048 | B2 | * | 4/2003 | Tailliet | 327/205 |
| 6,566,926 | B1 | * | 5/2003 | Patterson | 327/206 |
| 6,700,424 | B2 | * | 3/2004 | Feng | 327/206 |
| 6,870,413 | B1 | * | 3/2005 | Chang et al. | 327/205 |

* cited by examiner

Primary Examiner—My-Trang Nu Ton
(74) Attorney, Agent, or Firm—MacPherson Kwok Chen & Heid LLP; Jonathan W. Hallman

(57) ABSTRACT

A Schmitt trigger includes a PMOS transistor and an NMOS transistor, each having a gate coupled to an output voltage terminal. The Schmitt trigger is configured such that an input voltage that switches on the PMOS transistor determines a low voltage threshold and an input voltage that switches on the NMOS transistor determines a high voltage threshold. By coupling devices such as diodes to either or both of the PMOS and NMOS transistors, a margin between the low voltage threshold and ground and between the high voltage threshold and a supply voltage are maintained as the supply voltage is reduced. In addition, hysteresis is maintained or increased as supply voltage is increased.

19 Claims, 5 Drawing Sheets